March 12, 1963 R. M. LEEKLEY ETAL 3,081,168

POLYAMIDE PHOTOGRAPHIC PRINTING PLATE AND METHOD OF USING SAME

Filed Oct. 16, 1959

INVENTORS.
ROBERT M. LEEKLEY &
ROBERT L. SORENSEN
BY
Brumbaugh, Free, Graves & Donohue
their ATTORNEYS.

United States Patent Office 3,081,168
Patented Mar. 12, 1963

3,081,168

POLYAMIDE PHOTOGRAPHIC PRINTING PLATE AND METHOD OF USING SAME

Robert M. Leekley and Robert L. Sorensen, Westport, Conn., assignors to Time, Incorporated, New York, N.Y., a corporation of New York Filed Oct. 16, 1959, Ser. No. 846,951
17 Claims. (Cl. 96—35)

The present invention is concerned with a polyamide printing plate and with a process for preparing it.

This application is a continuation-in-part of copending application Serial No. 419,076, filed March 26, 1954, and now forfeited.

According to the present invention a printing plate is formed from a photosensitive polyamide resin composition by a process for photochemically decreasing the solubility of synthetic linear polyamides by reaction with unsaturated compounds having at least two vinylidene groupings. The printing plate is formed by selectively insolubilizing portions of the surface of the composition by exposure to radiant energy particularly actinic light.

The plates used in nonplanographic reproduction processes are for the most part made of metal, and are prepared by photoengraving. The metal is usually of zinc or magnesium alloy, and the plates are coated with a photo-sensitive resist composition which initially is soluble in certain developer solutions but which after exposure to light becomes insoluble in such developer solutions. If, therefore, such a coated plate is exposed to light through a photomechanical negative or positive, the areas beneath the opaque areas of the negative or positive through which light does not pass remain soluble in the developer, while the areas beneath the open areas of the negative or positive through which light did pass are rendered insoluble in such solutions. When the plate is contacted with the developer, the soluble areas are dissolved out, and the naked metal base of the plate is exposed in those areas, while the rest of the plate remains coated. These bare areas therefore correspond with the outlines of the image.

Next, the bare surface of the metal is etched out in the exposed areas, so as to form the image in relief. Nitric acid is generally used for etching zinc and magnesium alloy plates. Other acids may be used for plates made of other types of metals.

Figure 1:
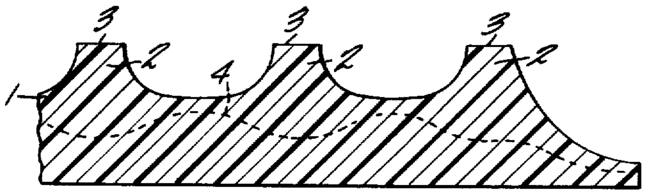

In FIGURE 1 there is shown the cross-section of what might be called the ideal half-tone relief printing plate. The base 1 of each individual printing element 2 is broad as compared to its top 3, so that the image is strong and the individual printing elements are not easily distorted or tilted. The sides of each element are sufficiently steep near the top printing surface so that the dot area does not increase rapidly with plate wear or with increased printing pressure. There is adequate depth, and there is no undercutting.

As FIGURE 1 shows, it is essential that the edges of the elements be sharp and well-defined if the final plate is to print the image cleanly. However, metal plates of the type of FIGURE 1 are not obtainable by simple etching, due to undercutting. The etching process is difficult to control, because it proceeds wherever bare metal lies exposed to the acid. Thus, as the etching process continues, the etching solution etches not only deeper into the plate but also deeper into the edges of the image. Such sidewise etching is called "lateral attack," and results in undercutting of the image, or in a widening of the etch at the top, or both.

In order to avoid undercutting, the etching is carried out in a series of "bites." In the first etch, after a slight relief has been built up, the plate is removed from the etching solution, washed and dried, and a resin or wax, or both, then applied to the edges of the relief image. The resin or wax is melted or banked into the lateral areas by holding the plate over a hot flame. The plate, when immersed a second time in the etching bath now will be protected from undercutting to a certain extent by the coating of the resin. As the etch deepens, more bare areas subject to undercutting are exposed, so that the protective coating loses its value and a new coating is needed, so that a new bank-in or burn-in follows. An etch of the normal depth may require four to seven etchings and bank-ins of this type.

This procedure has many disadvantages. Besides requiring much hand work in applying the resin so as not to coat the areas of the plate which must be etched still deeper, it is impossible to obtain a smooth contour of the lateral edges of the image relief. The general effect of the successive bites is to form a series of stepped shoulders on the relief, upon which shoulders the ink can accumulate during use, and give the effect of a plate which is only as deep as the first shoulder.

It can readily be shown that from the standpoint of plate surface configuration it is theoretically unnecessary to polymerize a printing plate throughout its depth. A plate of sufficient depth, of the configuration shown in FIGURE 1, can be obtained from a polymerization only as deep as the valleys. In fact, it can be shown to be undesirable to polymerize a plate throughout its thickness, from the standpoint of producing an optimum printing plate surface. In the combination plate of the type used in magazine printing, for example, the depth in the large open areas must be quite great, of the order of 30 to 60 mils, to prevent the accumulation of ink and the billowing or folding of the paper into such areas, with resultant printing where it is undesired. On the other hand, the depth between rows and within type spaces need not exceed 10 to 15 mils. In the half-tone areas, dependent upon the screen mesh and also whether the area is in a highlight, mid-tone or shadow region, the depth may range as low as 1 to 3 mils, controlled of course by the distance between the printing elements or dots. Obviously, in such a plate, the thickness of the layer must at least equal the greatest depth, but when the thickness is so great, polymerization practically cannot be effected throughout the exposed areas without losing depth in the half-tone areas, due to scattering, and without increasing the dimensions of the areas with overexposure, otherwise known as image-spreading.

Figure 2:
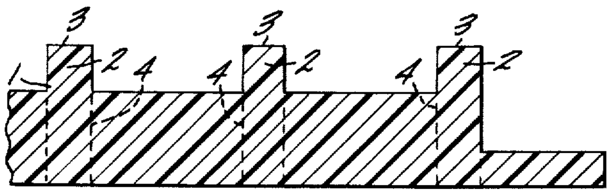

In FIGURE 2 there is shown schematically a half-tone printing plate with cylindrical printing elements. This type of plate can be made by exposing a fully transparent photosensitive plastic layer to a small or distant light source, and thus directing nearly all of the light perpendicularly (90°) to the plate. Light so directed is at an optimum angle for penetrating deeply into the plate, and polymerizes it throughout its depth in the exposed areas, but it does not produce a relief having a good shoulder support. The printing area of such a plate will not change with wear, but it is obvious that the greater the depth of the plate, the weaker it becomes, and that even at the same depth as the plate in FIGURE 1, it is much weaker. This is still further aggravated in a magazine combination plate, because during development etching will continue to an excessive depth in the half-tone areas, and the smaller dots will be exceedingly fragile.

Figure 3:
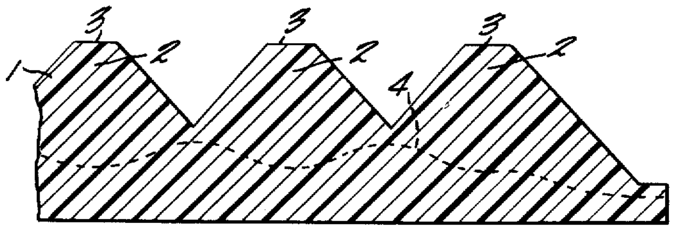

In FIGURE 3 there is shown schematically the cross-section of a half-tone plate which is obtained by exposing a fully transparent photosensitive composition to an oblique light source or by making use of the oblique rays from a large light source close to the plate. The angle of refraction used in FIGURE 3 is 42°, which is the limiting angle obtained with the most oblique light possible, i.e., at the grazing angle, when the refractive index is 1.5.

This type of incidence makes it more difficult for the light to penetrate deeply into the plate. Even so, the shoulders of the relief are not optimum. In this plate, the relief elements are frustrums of cones or pyramids. The depth between printing elements is a function only of where the side surfaces intersect. It is obvious that the printing dots shown in this type of plate will change their area rapidly as the plate begins to wear, and that such a plate will tend to print an increased area with increased pressure.

Since all plate materials have refractive indices greater than air, the angle of refraction will always be less than the angle of incidence. The limiting exposure taper angle, which is the angle between the side of the exposed printing element and the normal to the surface of the plate being exposed, is determined by the light incident at a grazing angle and is given by the expression $$\sin \alpha = \frac{1}{n}$$

where $n$ is the refractive index of the photosensitive material. For a composition having a refractive index of 1.5, the limiting value for the taper angle is, therefore, approximately 42°. In actual practice, the taper angle is somewhat smaller, since it is not practical to obtain any large portion of the illumination at the grazing angle. However, since the taper angle controls the depth, this results in plates that are even deeper than FIGURE 3.

In accordance with the instant invention compositions are provided which make it possible to obtain half-tone plates having the desirable cross-sectional configuration shown in FIGURE 1.

This result is obtained by formulating a composition which is so composed that a substantial portion of the light which is passed into the composition is scattered, but in such a way that even the scattered light proceeds in substantially the direction at which the light enters the plate. The effect of this directed scattering is to increase the shoulder support for the relief with increasing depth.

In the preferred composition of the invention, when oblique light is used the small amount of light which is scattered at greater than the angle desired to increase shoulder size is rendered ineffective by furnishing throughout the composition a sufficiently high concentration of a photoinitiator which tends to absorb a part of the light entering the composition very strongly, and, as a result, initiates the polymerization, and by providing throughout the composition a sufficiently high concentration of polymerization inhibitor to raise the threshold of polymerization of the polymerizable components of the composition such that the portions in the nonexposed areas are not polymerized by the small amount of feeble scattered light which enters such areas and is not absorbed by the photoinitiator. But the inhibitor is not necessary when columnated light is used. When columnated light is used, the amount of inhibitor can be much reduced or even eliminated, and the amount of photoinitiator much reduced as well, because light scattering is much reduced due to the angle of incidence of the light. Thus, it is possible to prevent the insolubilization of the unexposed areas which are to be developed out, and at the same time form a barrier or floor of photoinsolubilized material in the nonlight-exposed areas of smaller area which prevents the material not photopolymerized from being dissolved out in the developer. In the larger nonexposed areas, the floor does not form, but this is of no consequence because a greater depth of etch is desired here and control is obtained by limiting development time to that needed in that area.

Further in accordance with the invention, the photosensitive compositions are based upon pre-formed synthetic linear polyamides as the synthetic resin component. These polyamides preferably are not themselves photosensitive. They are commonly known as nylons, and constitute a well recognized class of chemical substances, normally characterized by extreme hardness and good wearing qualities, fitting them particularly for use as printing plate surfaces, and by solubility in only a few organic solvents. Since they constitute the main component of the plate surface, and are already more or less fully polymerized, it is quite unnecessary completely to polymerize the composition of the invention throughout the plate. Moreover, they are relatively unaffected by the developer composition, except for a uniform dissolving action at the surface, so that the material beneath the surface is not greatly swollen or distorted.

Photosensitivity is imparted to the polyamides in the compositions of the invention by the combination of a photoinitiator and a photopolymerizable unsaturated compound, as hereinafter defined.

According to the present invention there are prepared photosensitive polyamide compositions containing unsaturated compounds having at least two vinylidene groupings. The solubility of the synthetic linear polyamide is decreased when the mixture of polyamide and unsaturated material is subjected to radiant energy.

The synthetic linear polyamides which may be used in the present invention are well known materials which are available commercially from a plurality of manufacturers. Suitable polyamides include those described in U.S. Patent Nos. 2,071,250, 2,071,253, 2,130,523, 2,320,088, 2,430,860 and 2,441,057. The polyamides are thermoplastic synthetic linear polycarbonamides containing polyamide groups as an integral part of the polymer chain. Throughout the specification they will often be referred to by the preferred term nylon.

The compound which is reacted with the polyamide in order to be operative must contain at least two vinylidene groupings. However, it is anomalous that compounds which contain, as the only unsaturated groups, two allyl groups, are inoperative in the invention while compounds having three allyl groups are operative. The situation is summarized by saying that the unsaturated compound must contain at least two vinylidene groups but must have at least one additional vinylidene group when two allyl groups are present. The unsaturated compound also should have a boiling point of at least 100° C. in order not to evaporate excessively under the conditions of the process. Unsaturated compounds which meet this description and which have been found suitable in the practice of the invention include, for example, N,N'-methylene bisacrylamide, N-allylacrylamide, N,N-diallylacrylamide, ethylene diacrylate, ethylene bisallylmaleate, diallylmaleate and triallylcyanurate.

Preferred examples of the unsaturated compounds to be used in the present invention are those having the structure $$CH_2=\underset{R}{C}-CONH-X-NHCO-\underset{R'}{C}=CH_2$$

in which X is a straight or branched alkylene chain having a total of from one to ten carbon atoms, preferably from one to six carbon atoms, and having not more than six carbon atoms in a straight chain connecting the nitrogen atoms of the amido groups, the remaining carbon atoms in excess of six, if any, being present as alkyl radicals attached to the said chain, and R and R' are selected from the group consisting of hydrogen and lower alkyl groups having from one to five carbon atoms. Preferably, R and R' are hydrogen, and next preferably, methyl. Experience indicates that as the molecular weight increases, reactivity decreases, so that compounds of lower molecular weight would be used generally in preference to compounds of higher molecular weight. Such compounds are capable of forming cross linkages with polyamide resins, and it is suggested that the effectiveness of these compounds in the invention is due to the formation of such cross links. However, this is merely a hypothesis. Whether cross links are formed is not known. Nonetheless, the invention makes possible the production of photosensitive polyamide resin compositions and of printing plates of such synthetic linear polyamide compositions.

Another group of preferred unsaturated compounds for use in the present invention are those compounds having the structure $$CH_2=\underset{\displaystyle R}{\underset{|}{C}}-CONH-X-CONH-CH_2CH=CH_2$$

in which X is a straight or branched alkylene chain having a total of from one to ten carbon atoms, preferably from one to six carbon atoms, and having not more than six carbon atoms in a straight chain connecting the nitrogen of the first amido group and the carbon of the second amido group, and the remaining carbon atoms in excess of six, if any, being present as alkyl radicals attached to said chain, and R is selected from the group consisting of hydrogen and lower alkyl groups having from one to five carbon atoms. Preferably, R is hydrogen, and, next preferably, methyl. Experience indicates that as the molecular weight increases, reactivity decreases, so that compounds of low molecular weight would be used generally in preference to compounds of higher molecular weight. Such compounds are capable of forming cross linkages with polyamide resins, and it is suggested that the effectiveness of these compounds in the invention is due to the formation of such cross-links. However, this is merely a hypothesis. Whether cross links are formed is not known. Nonetheless, the invention makes possible the production of photosensitive polyamide resin compositions and of printing plates of such synthetic linear polyamide compositions.

The light-sensitive polymerizable compounds used in the present invention are easily prepared by conventional reactions well known to those skilled in the art. See, for example, Patent 2,475,846. Unsaturated compounds which come within the invention and which have been found to be particularly satisfactory include, for example, N,N'-methylenebisacrylamide, N,N'-hexamethylenebismethacrylamide, N,N'-hexamethylenebisacrylamide, N,N'-methylenebismethacrylamide, 2-acrylylamino-N,N'-diallylglutaramide, acrylylamino-N-allylacetamide, and 5-acrylylamino-N-allylcaproamide.

The synthetic linear polyamides which may be treated in accordance with the invention are well known materials. The term "polyamide" as used in the specification and in the claims means polymers of aminocarboxylic acids, polymers of dicarboxylic acids and diamines, and interpolymers of both these types of polymers. Such polyamides are described in U.S. Patents Nos. 2,071,250, 2,071,253, 2,130,523, 2,320,088, 2,430,-860 and 2,441,057, and in J. Polymer Science, 2, 306–313, 412–419 (1947) and 3, 85–95 (1948), for example, ε-caprolactam polymers, sebacic acid-hexamethylene diamine polymers, adipic acid-hexamethylene diamine polymers, and the interpolymers of ε-caprolactam with sebacic acid and/or adipic acid and hexamethylene diamine, in varying proportions. The polyamide must be compatible with the unsaturated compound, and when intended for use in the preparation of printing plates must be soluble in the developer, which will usually be boiling methanol or a solution of from 0.25 to 150 g. calcium chloride per 100 cc. of a water-miscible alkanol such as methanol or ethanol. The reaction product of the polyamide and the unsaturated compound must be sufficiently insoluble in the developer under the development conditions to be substantially unaffected thereby after thirty minutes of development.

The relative proportions of the polyamide and the unsaturated compound may be varied as desired, or as conditions may require, but ordinarily the proportions thereof in the mixture will be within the range disclosed by the working examples set forth hereinafter.

One method of preparing the photosensitive mixture of polyamide and unsaturated compound comprises forming a solution of these two materials in an organic solvent, e.g. a lower alkanol, such as methanol or ethanol. This can be used as a coating composition by applying the solution to a base material in the form of a film and evaporating the solvent. This is the method that would be used when no polymerization inhibitor is present. Self-supporting films can be prepared by using a base from which the film is stripped. The mixture may also be prepared in the form of a melt, and the melt may be extruded, injection molded or compression molded in the form of sheets or plates.

It is desirable to include a polymerization inhibitor in the composition, especially when the composition is extruded or molded. The inhibitor should be substantially heat-stable at polyamide molding temperatures. The preferred inhibitors constitute as a class aromatic compound having a structure selected from the group consisting of

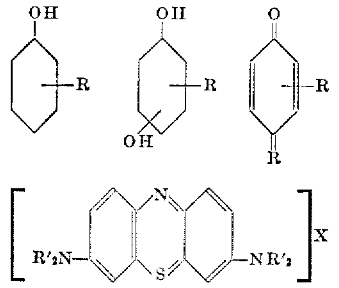

where R is hydrogen, alkyl and alkoxy having from one to five carbon atoms, or aryl alkoxy having from six to eleven carbon atoms, R' is hydrogen or alkyl having from one to five carbon atoms, and X is a salt-forming anion, such as halogen, i.e., chloride or bromide, sulfate, or nitrate. These classes of compounds introduce an induction period or delay in the photopolymerization of the photosensitive components in the polyamide resin composition, whether these components are incorporated as light-sensitive units directly in the polyamide molecule or as photopolymerizable compounds incorporated as adjuncts to the composition. This period of delay may be quite short or even infinitesimal in strongly illuminated areas, but it is helpful in the nonilluminated areas to prevent polymerization due to scattered light entering such areas. As examples of such preferred polymerization inhibitors, there can be mentioned pyrogallol, quinone, hydroquinone, methylene blue, t-butyl catechol, hydroquinone monobenzyl ether, methyl hydroquinone, amyl quinone, amyloxy hydroquinone, n-butyl phenol, phenol, and hydroquinone monopropyl ether. These inhibitors or stabilizers are well known.

In an amount within the range from 0.001 to 1% by weight of the composition these inhibitors prevent thermal polymerization of the composition during the molding and extrusion. During exposure, such amounts delay and thus prevent photopolymerization due to scattered light in the nonexposed areas of the composition, but do not greatly interfere with or delay the photopolymerization of the composition in strongly exposed areas, thus aiding in formation of a plate of optimum depth and surface configuration.

Interreaction of the polyamide and the unsaturated compound even in the presence of the inhibitor can be effected by subjecting the mixture of the two components to a source of actinic light of sufficient intensity. However, in order to obtain the optimum degree of insolubilization and a faster reaction, it is preferred to effect the reaction in the presence of an amount of a light-sensitive photoinitiator which absorbs light very strongly, and initiates the polymerization. Compounds which are known to promote analogous photopolymerization reactions can be used.

Among the photoinitiators known to be primarily sensitive to light, several of those which have the nucleus

in which the phenyl group may bear substituents such as hydroxyl or carboxyl radicals, have been found especially suitable. Representative light-sensitive photoinitiators which have this nucleus and which are suitable are benzil, benzoin, benzaldehyde, benzoin acetate, and acetophenone. Other keto compounds such as butanedione may also be used, as well as benzoyl peroxide. Benzilic acid also is useful.

Particularly desirable are benzophenone and the substituted benzophenones having the following formula:

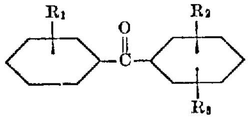

where $R_1$, $R_2$ and $R_3$ are selected from the group consisting of hydrogen; halogen; hydroxyl; carboxylic COOH; carboxylic salts COOM, where M is a metal cation, e.g., an alkali metal; carboxylic ester COOR, where R is alkyl of one to five carbon atoms; alkyl of one to five carbon atoms, e.g. $CH_3$; amino $NH_2$ or substituted amino $NR_4R_5$ and $R_4$ and $R_5$ are alkyl or hydrogen, the alkyl having one to five carbon atoms; and alkoxy, the alkyl having one to five carbon atoms.

Catalytic activity is diminished by chelating radicals in positions ortho to the carbonyl group. Such radicals include hydroxyl and amino groups. The compounds, therefore, should be free from ortho chelating groups.

When a photoinitiator is employed to accelerate the reaction, the concentration is usually small and preferably ranges from about 0.01% to about 10% photoinitiator by weight of the composition. Usually 1 to 5% would be used. The amount will depend upon the amount of absorption desired. Since the light-sensitive photoinitiator absorbs light, it affects the penetration of light into the composition. Therefore, the amount of photoinitiator must be chosen to give an adequate rate of photopolymerization at the surface and at the same time permit sufficient light to penetrate far enough to prevent any undercutting of the image during development. A reasonably high concentration of the photoinitiator is also effective in absorbing the small amount of light which is scattered laterally within the composition into the nonimage areas at greater than the angle desired to increase shoulder size. This scattered light is thus prevented from effecting undesired polymerization in the nonimage areas.

If the photoinitiator chosen is primarily light-sensitive, the reaction is preferably effected by exposing the mixture to a source of actinic light. Ultraviolet light is generally more effective than ordinary light. The time required for a light-promoted reaction will vary considerably depending upon the amount of photoinitiator used, the reactivity of the mixture, the depth of plate desired, and the conditions of reaction, but, under ordinary conditions, from one to thirty minutes, in rare instances up to several hours, will be required.

The depth of plate in a half-tone area decreases as the amount of photopolymerization in the nonimage areas increases. Therefore, plates get shallower with greater exposure. The depth to which a line or type image can be developed without undercutting increases with exposure, because the depth to which the image area is photopolymerized increases with exposure.

If no photoinitiator is used, longer periods of exposure will generally be required, and the degree of insolubilization possible is normally not as great as that achieved by the use of a photoinitiator.

It is important that the final photosensitive composition be translucent so as to permit the passage of light in sufficient quantity to effect the polymerization to the desired depth. A very high degree of translucency is not required, since polymerization need not extend all the way through the plate. A turbidity of from about 0.01 to about 0.5 $\text{mil}^{-1}$ is satisfactory. This is determined as follows:

The light transmission T of a sample to a depth $t$ below the surface can be related to its turbidity in $\text{mils}^{-1}$ by the following expression:

$$T=(1-R)10^{-(kc+\gamma)t}$$

or $$kc+\gamma=\frac{\log(1-R)-\log T}{t}$$

where $\gamma$=turbidity of film
$T$=transmission
$R$=reflection coefficient at surface
$k$=absorption coefficient
$c$=concentration of photoinitiator
$t$=depth in mils If it is assumed to be desirable that at least 10% of the light be transmitted to 2 to 5 mils below the surface, then $kc+\gamma$ must be in the range of 0.5 to 0.2. If absorption is negligible, then $kc$ is equal to 0 and this fixes the upper limit of $\gamma$ at 0.5 $\text{mil}^{-1}$. On the other hand, if the absorption is appreciable, then $\gamma$ may be very small. Assuming that 5 to 10% of the attenuation of the primary beam is due to scattering to build up the base on the dot, the lower limit of $\gamma$ falls at approximately 0.01 to 0.02 $\text{mil}^{-1}$.

If benzophenone is assumed to be the only absorber present and $c$ is expressed in percent and $t$ in mils, then $k$ is equal to $7\times10^{-3}$. This value was arrived at using a value of $\log E=1.7$ for benzophenone at 365 m$\mu$.

The reflection coefficient R can be calculated from Fresnel's law, which for normal incidence reduces to $$R=\frac{(n-1)^2}{(n+1)^2}$$

In this expression, $n$ is the refractive index. A value of $n=1.5$ is quite reasonable for a polyamide plate composition of the invention. This is based upon the fact that polyhexamethylene adipamide and polycaprolactam have a refractive index of approximately 1.53. The benzophenone is approximately 1.55 and the unsaturated compound can be expected to be of the order of 1.5. In practice, values of $n$ between 1.4 and 1.6 have very little effect upon the calculated value for $\gamma$.

The invention is valuable in forming printing plates and films made wholly of the photosensitive composition. These embodiments are photosensitive throughout. The present process also makes possible the formation of coated printing plates on any base by the deposition by any known process of films or coatings of the photosensitive polyamide composition thereon. Typical bases are metal sheets, sheets made of synthetic resins and cellulose derivatives, fabrics, paper, and leather. The plates formed wholly of or coated with the photosensitive polyamide compositions are useful in photography, photomechanical reproductions and lithography. More specific examples of such uses are offset printing, silk-screen printing, duplicating pads, manifold stencil sheeting coatings, lithographic plates and relief plates. The term "printing plate" as used in the specification and claims is inclusive of all of these.

A specific application of the invention is illustrated by a typical preparation of a printing plate. In this application, a plate, usually of metal or a resilient sheet material, is formed wholly of, or coated with a film of, the photosensitive mixture of polyamide and copolymerizable monomeric compound, and the surface of the plate is brought into close contact with a negative image composed of transparent and opaque areas on film or glass.

The plate is then exposed to light. The light induces the photopolymerization reaction which insolubilizes the areas of the surface beneath the transparent portions of the image, while the areas beneath the opaque portions of the image, being shielded from light, remain soluble.

The soluble areas of the surface are removed by a developer to sufficient depth that the insoluble raised portions which remain can be used as a relief printing plate. However, it is possible to use the composition in other manners. A thin film can be used to form a resist image on a metal or other support. After development, the base material can be etched with chemical etching agents such as acid or ferric chloride or by an abrasive blast to form a relief image in the base material. Similarly, a bimetal offset plate can be prepared using the composition as a resist stencil. Another type of offset plate can be prepared by coating the composition on a suitable hydrophilic support. The nylon image obtained by development will carry the ink and the wet support will resist ink.

In exposing the photosensitive polyamide compositions it is desirable that some light strike the plate at a high angle of incidence. This is conveniently accomplished by using a large light source such as a bank of tubular lights or by causing the plate to move past a tubular light source. The optimum amount of oblique light will be dependent on the light scattering characteristics of the photosensitive polyamide and can be controlled if necessary with baffles.

Whenever oblique light is used for exposure, excellent contact between the negative and the photosensitive plate is essential if broadening of the image elements is to be avoided. The emulsion side of the negative should be placed in direct contact with the plate without any spacing layer. However, a spacer can be used if it is desired to broaden the image elements. It is highly desirable to use a vacuum frame to hold the negative and plate in intimate contact.

The following examples are given solely for purposes of illustration and are not to be considered as limiting the invention to these embodiments. Many modifications will be apparent to those skilled in the art without departing from the spirit or scope of the invention.

EXAMPLE 1

A thin sheet of anodized aluminum was laid on a hot plate maintained at 35° C. A nylon casting solution was mixed as follows:

125.2 g. alcohol-soluble interpolymer of hexamethylenediammonium adipate, hexamethylenediammonium sebacate, and $\epsilon$-caprolactam (composition: 40:30:40 [by analysis], softening point 144° C.), dissolved in ethanol
1.88 g. N,N'-methylenebisacrylamide
0.50 g. benzophenone Using a drawdown applicator with a 0.05 inch clearance, four films were cast, one on top of another, on the aluminum sheet, forming a photosensitive printing plate. Between applications of the four films approximately one hour was allowed for evaporation of the solvent. When the last layer had dried to the extent that there was no surface tack, the composite assembly of polyamide film and aluminum was removed from the warm plate, and different sections thereof were exposed in a vacuum apparatus to a carbon arc for 35 minutes through two negative transparencies. One negative was a 120-line halftone picture and the second was a section of photocomposed type. During the exposure, a vacuum of about 29 inches of mercury was maintained.

The light-exposed plate was then placed in a cabinet and splashed for 15 minutes at 110° F. with a developer solution composed of a calcium chloride solution in ethanol having a specific gravity of 0.95.

The photoinsolubilized printing plate was removed from the cabinet and examined with a microscope. Type and half-tone relief images were found to have been formed in the polyamide layer. In the type areas, etch depth over 0.02 inch was found between rows of letters. There was no evidence of undercutting or side etching in these deep areas. The printing plate was then inked and successfully printed as a letter press type relief printing plate.

EXAMPLE 2

An ethanol solution of the following ingredients was prepared:

18 parts polyamide of Example 1
2 parts N,N'-methylenebisacrylamide
1 part benzophenone The solution was cast on a glass plate maintained at 32° C., and spread evenly with a drawdown applicator having a 0.024 inch clearance. The film was allowed to stand until substantially all surface tack had disappeared. One-half of the cast film was exposed under vacuum to a carbon arc for 30 minutes; the remainder of the film was kept under cover away from light. Separate pieces of the exposed and unexposed films were oven-dried at 60° C., weighed, and then immersed in boiling methanol for a period of 4 minutes. The exposed sample was removed from the methanol, oven-dried at 60° C., and weighed again. It was found that the film lost only 15% of its original mass during the methanol treatment. The unexposed film, however, quickly dissolved when placed in the boiling methanol to the extent of 100% weight loss. The light-exposed film was clear, strong and flexible. When a small piece of the exposed film was placed on a hot plate along with a sample of the pure polyamide, the pure film melted, whereas the exposed film of the invention did not melt or lose its shape.

EXAMPLE 3

A drawdown film was made according to the exact procedure of Example 2 with the exception that the 1 part of benzophenone was replaced with 1 part of benzoyl peroxide. The film was then exposed to light according to the procedure of Example 2, and small pieces of the exposed film were oven-dried at 60° C., weighed and given the boiling methanol treatment. The exposed portions of the film showed a weight loss of 39%, while the unexposed portions of the film showed a weight loss of 100%.

EXAMPLE 4

A drawdown film was cast and dried by the procedure of Example 2 using an ethanol solution containing 18 parts of the polyamide of Example 1, and 2 parts of N,N'-methylenebisacrylamide. A portion of the film was then heated at 105° C. for 4 hours. The film was then weighed and immersed in boiling methanol for 4 minutes. After drying and reweighing the film, it was found that 60% of the original mass was lost during the methanol treatment, but an unheated portion of the same film quickly dissolved in boiling methanol.

EXAMPLE 5

The entire procedure of Example 4 was followed with the exception that the film was exposed to a carbon arc for 30 minutes instead of being heated. The exposed portion of the cast film had a weight loss of 80% after the boiling methanol treatment, but the unexposed portion of the film readily dissolved in boiling methanol.

EXAMPLE 6

A drawdown film was prepared according to the procedure of Example 2, from an ethanol solution containing 18 parts of the polyamide of Example 1, 2 parts N,N'-methylenebisacrylamide, and 1 part benzoyl peroxide. A small section of the glass plate and film was heated in an oven at 105° C. for 4 hours. The film was weighed and immersed in boiling methanol for 4 minutes, dried and reweighed. The weight loss of the heated film was only 35%, whereas the unheated film quickly dissolved in boiling methanol. The heated film was clear, strong and flexible and, when a small piece of the heated film was placed on a hot plate along with a sample of the pure polyamide, the pure film melted, whereas the heated film of the invention did not melt or lose its shape.

EXAMPLE 7

The procedure of Example 2 was followed in preparing and exposing film, from an ethanol solution containing 18 parts of the polyamide of Example 1, 2 parts N,N'-methylenebisacrylamide, and 1 part of 4-hydroxybenzophenone.

When immersed in boiling methanol for 4 minutes, the exposed portion of the film suffered a weight loss of only 23%, while the unexposed portion of the film quickly dissolved. Further, the exposed portion of the film was clear, strong and flexible and did not melt when placed on a hot plate.

EXAMPLE 8

9.7 parts of N,N'-methylenebisacrylamide and 5 parts of benzophenone were dissolved in a small quantity of anhydrous ether. This solution was then poured over 90 parts of finely divided alcohol-soluble interpolyamide of Example 1 and mixed until the mass was dry. The powder was placed in a flash-type molding cavity equipped with a cut-off and, under a pressure of 10,000 lbs. and a temperature of 135° C., was formed into a molded disc. This mold was slowly cooled and the disc removed from the mold at room temperature. The disc was photoprinted using a type negative and a carbon arc exposure of thirty minutes. These were developed in a splash machine using developer with a specific gravity of 0.95 formed by dissolving anhydrous calcium chloride in ethanol. A relief-type printing plate was obtained.

EXAMPLE 9

To 150 parts of anhydrous methanol were added 90 parts of the alcohol-soluble interpolyamide of Example 1, 10 parts of N,N'-methylenebisacrylamide, 0.01 part of methylene blue, and 5 parts of benzophenone.

Upon heating and stirring, a complete solution was formed. A photosensitive film was formed by casting the solution on a glass plate and drying overnight. The film was then cut into small pieces, placed in a molding cavity, and a molded printing plate was formed using a pressure of 10,000 lbs. and a temperature of 135° C. After the mold was cooled to room temperature, the photosensitive plate was removed from the cavity. The plate was photoprinted through a negative type image using a carbon arc exposure of 30 minutes. The photoinsolubilized plate was developed for 20 minutes at 110° F., using a developer with a specific gravity of 0.95 formed by dissolving anhydrous calcium chloride in anhydrous methanol. A letterpress relief printing plate containing type images 0.04 inch deep, corresponding to the light areas of the negative, was then obtained.

EXAMPLE 10

The following solution was made:

500 parts of anhydrous methanol, 44 parts of N,N'-methylenebisacrylamide, 69 parts of benzophenone, and 0.44 part of pyrogallol. About 25 parts of powdered alcohol-insoluble polyhexamethyleneadipamide were placed in this solution and the solution allowed to stand for 72 hours. The nylon was filtered from the solution, and vacuum-dried two hours at 60° C. The powder was placed between two metal plates and was fused into a thin sheet by immersing in a molten lead bath at 525° F. for 2 minutes. The photosensitive sheet was exposed through a type negative by a 2-hour carbon arc exposure, and the exposed photoinsolubilized sheet was developed in the splash machine using a solution of 100 g. of anhydrous calcium chloride in a liter of methanol for 10 minutes. A relief-printing plate was obtained, having relief images of type formed during this development.

EXAMPLE 11

To 120 parts of alcohol were added 90 parts of the alcohol-soluble interpolyamide of Example 1, 5 parts of N,N'-hexamethylenebismethacrylamide, 1 part of benzophenone, and 0.07 part of methylene blue. This mixture was then heated at about 140° F. until a complete solution was obtained. The material was cast into a sheet, allowed to dry and cool, chopped by a conventional plastics chopper to a small pellet form, and dried for 48 hours at room temperature. The pellets were then placed in a heated sheet mold at 315° F. for 4 minutes. The mold was then placed in a press with cold platens, and a total load of 12,000 lbs. was applied to the mold.

After the mold had reached room temperature, it was opened and a clear photosensitive nylon plate was removed. This plaque was exposed through a negative containing both type and half-tone to a carbon arc for a period of 1 hour. The photoinsolubilized plate was then developed in a splash developing machine operating at 100° F. for a period of 15 minutes, using a developer formed by dissolving 90 g. of anhydrous calcium chloride in 1 liter of methyl alcohol. When the plate was dried, there were relief images of type and half-tone formed into the plate surface, corresponding to the light areas on the negative. It was a letterpress relief-printing plate.

EXAMPLE 12

A solution of the following materials was made:

72 parts of methanol, 90 parts of the alcohol-soluble interpolyamide of Example 1, 7 parts of N,N'-methylenebismethacrylamide, 1 part of benzophenone, and 0.07 part of methylene blue.

The solution was cast and air-dried 24 hours to produce a dry film. This was cut to small chips, placed in the hot molding cavity at a temperature of 440° F., and under a pressure of 6,000 lbs. was formed into a solid photosensitive nylon plate. Using a negative type image, the plate was exposed to a carbon arc for 1 hour, then developed in the splash etching machine at 100° F. for 15 minutes using the developer composed of 90 g. of anhydrous calcium chloride in 1 liter of methanol. The developed relief printing plate had relief images of letterpress type, corresponding to the light areas of the negative.

EXAMPLE 13

A solution was formed from 72 parts of methanol, 90 parts of the alcohol-soluble interpolyamide of Example 1, 7 parts of N,N'-methylenebismethacrylamide, and 1 part of benzophenone. Following the same procedure as outlined in Example 12, letterpress relief-type images were formed in a molded blank by the developing operation. A relief printing plate was obtained.

EXAMPLE 14

An injection molded plaque of alcohol-insoluble polyhexamethyleneadipamide was placed in a methanol solution for one week. The solution was composed of 1500 parts of methanol, 14.1 parts of N,N'-methylenebisacrylamide, and 7.1 parts of benzophenone. After one week, the plate was removed from the solution, blotted dry, and air-dried for 1½ hours. It was exposed for 1 hour by a carbon arc through a negative image containing both type and 120-line half-tone. It was then splash-developed for 12 minutes at 100–110° F., using a developer of a specific gravity of 0.877 formed by dissolving calcium chloride in anhydrous methanol. Letterpress images in relief of type and half-tone were formed in the plaque by the developing operation, and the plaque was converted into a relief printing plate.

EXAMPLE 15

A solution containing 30 parts of ether, 1 part of benzophenone, and 0.1 part of pyrogallol was poured on 10 parts of N,N'-methylenebisacrylamide that had been previously passed through a 60-mesh screen. This mixture was then stirred until dry and placed in a tumbling bottle with 90 parts of poly ε-caprolactam, which had also been screened through a 60-mesh screen, and was tumbled for a period of eight hours. The photosensitive powder was then molded into flat plates in an injection molding machine, using cylinder heating temperatures of 420–440° F. and a mold temperature of 175° F.

The photosensitive polyamide plates were exposed to a carbon arc for one hour through a negative containing both type and half-tone images. The exposed photoinsolubilized plate was developed in the splash etching machine for twelve minutes, using a developer of a specific gravity of 0.9 formed by dissolving anhydrous calcium chloride in methanol. Half-tone and type relief images, corresponding to the light areas of the negative, were formed in the plate surface by this photoprinting and developing operation. The plate was a true relief printing plate and capable of use in a letterpress.

EXAMPLE 16

In 120 parts of methyl alcohol were dissolved 90 parts of the alcohol-soluble interpolyamide of Example 1, 5 parts of N,N'-methylenebismethacrylamide, 1 part of benzophenone, and 0.07 part of methylene blue. These were heated at about 140° F. until a complete solution was obtained, and then the viscous solution was cast upon a Teflon (polytetrafluoroethylene)-impregenated glass cloth belt, and allowed to cool and dry until a sheet was formed. The material was then chopped in the conventional plastics chopper and placed in a mold cavity at 315° C. for 4 minutes. The pressure on the cavity was then increased to 12,000 lbs. and the platens were brought to room temperature.

The molded photosensitive plate was then exposed through a type and half-tone negative by a carbon arc for a period of 1 hour. It was placed in the splash developing machine and developed for 15 minutes at 100° F., using as a developer a solution formed by dissolving 90 g. of calcium chloride in 1 liter of methanol. After drying, the relief printing plate surface had letters and half-tone dots in relief, as any normal letterpress printing plate.

EXAMPLE 17

To 120 parts of methyl alcohol were added 90 parts of the alcohol-soluble interpolyamide of Example 1, 5 parts of N,N'-hexamethylenebisacrylamide, 1 part of benzophenone, and 0.07 part of methylene blue.

The mixture was heated at 140° F. until a complete solution was obtained. The further processing, drying, molding, exposing and developing were the same as shown in Example 16. The developed relief plate showed type and half-tone relief images which could be used for letterpress printing.

EXAMPLE 18

To 120 parts of methanol were added 90 parts of the alcohol-soluble interpolyamide of Example 1, 7.8 parts of N,N'-hexamethylenebisacrylamide, 5 parts of p-benzoylbenzoic acid, and 0.035 part of methylene blue.

After the mixture was heated at 140° F. for about 2 hours, a clear solution was formed which was then cast and dried into a sheet. This material was then chopped and air-dried for an additional 48 hours. The chopped material was placed in a heated molding cavity at 350° F. for 3 minutes. The hot mold was then placed in a cold press and squeezed at 50,000 lbs. until the mold was cold. A clear, uniform photosensitive molded nylon plate was removed from the mold cavity.

The molded plate was then exposed through a negative image containing type and half-tone to a water-jacketed UA11 (General Electric) lamp, a 1200 watt (quartz tube) medium pressure mercury vapor lamp, for a period of 6 minutes at a spacing of 4 inches.

The exposed photoinsolubilized plate was then developed for a period of 10 minutes in a splash developing machine at 80° F., using a developer composed of 90 g. of calcium chloride dissolved in 1 liter of methanol. The plate was then dried, and the surface of the plate now had relief half-tone and type images, and was suitable for use as a letterpress printing plate.

EXAMPLE 19

To 120 parts of methanol were added 90 parts of the alcohol-soluble interpolyamide of Example 1, 5 parts of N,N'-methylenebisacrylamide, 5 parts of p-benzoylbenzoic acid, and 0.035 part of methylene blue.

Following the same procedure as outlined in Example 18, the exposed and developed plaque contained relief images of half-tone and type and could be used as a letterpress relief printing plate.

EXAMPLE 20

To 120 parts of methyl alcohol were added 90 parts of the alcohol-soluble interpolyamide of Example 1, 5 parts of N,N'-methylenebisacrylamide, 6.25 parts of benzilic acid, and 0.035 part of methylene blue. This mixture was heated until a complete solution was obtained. Following the same process procedures as outlined in Example 18, the exposed and developed plaque contained the relief images of half-tones and type, and could be used as a letterpress printing plate.

EXAMPLE 21

To 120 parts of methyl alcohol were added 90 parts of the alcohol-soluble interpolyamide of Example 1, 5 parts of N,N'-methylenebisacrylamide, 5 parts of benzophenone, and 0.05 part of hydroquinone. This mixture was then heated at about 140° F. until a clear solution was obtained. The solution was then handled and processed as outlined in Example 18, and the exposed and developed plaque showed relief images, both line and half-tone, and could be used as a letterpress printing plate.

EXAMPLE 22

To 120 parts of methyl alcohol were added 90 parts of the alcohol-soluble interpolyamide of Example 1, 5 parts of N,N'-methylenebisacrylamide, 5 parts of benzophenone, and 0.05 part of tertiary-butyl catechol. This mixture was then heated at about 140° F. until a clear solution was obtained.

After processing as outlined in Example 18, the exposed and developed plaque contained relief images of half-tone and type and was suitable for use as a letterpress printing plate.

EXAMPLE 23

To 120 parts of methyl alcohol were added 90 parts of the alcohol-soluble interpolyamide of Example 1, 5 parts of N,N'-methylenebisacrylamide, 1 part of benzophenone, and 0.05 part of quinone. The mixture was then heated at about 140° F. until a clear solution was obtained. Following the same procedures as outlined in Example 18, the exposed and developed plate exhibited relief images of type and half-tone and could be used as a letterpress printing plate.

EXAMPLE 24

To 120 parts of methyl alcohol were added 90 parts of the alcohol-soluble interpolyamide of Example 1, 5 parts of N,N'-methylenebisacrylamide, 1 part of benzophenone, and 0.05 part of hydroquinone. This mixture was heated at 140° F. until a solution was obtained. This was then cast and dried into a sheet.

After chopping the sheet into small pellets, the pellets were fused into a solid molded plate by placing them in a 350° F. heated mold for 3 minutes, followed by pressing at 40,000 lbs. in a cold press. The molded photosensitive plate was exposed through a negative containing type and half-tone, by a G.E. UA11 mercury lamp, for a period of 6 minutes. The plate was then placed in a splash developing machine and developed for 15 minutes at 80°

F., with a developing solution formed by dissolving 90 g. of calcium chloride in 1 liter of methanol. After drying the plate, the relief images of type and half-tone were suitable for printing by the letterpress method.

EXAMPLE 25

100 parts of alcohol-soluble N-methoxymethyl polyhexamethyleneadipamide were dissolved in 570 parts of absolute methyl alcohol at 60° C. The nylon had a melting point of 170–180° C. and a dilution value of 54, using the acetone-precipitation method described by Cairns et al., J. Am. Chem. Soc., 71, 653 (1949). These properties correspond to a methoxyl content of about 8.3%. In the polymer solution were dissolved 5 parts of N,N'-methylenebisacrylamide, 5 parts of benzophenone, and 0.07 part of methylene blue. The solution was cast into a sheet, air-dried, and cut into chips. The chips were molded into a plaque at 160° C., using 5,000 p.s.i. After cooling, the photosensitive plaque was exposed through a type negative in a vacuum frame for 6 minutes at 4 inches from a water-jacketed UA11 lamp. The exposed plaque was splash-developed for 5 minutes at 25° C. in a solution of absolute methyl alcohol containing 90 g. of anhydrous calcium chloride per liter of methanol. The developed plaque had relief characters corresponding to the transparent areas of the negative, and could be used as a letterpress printing plate.

EXAMPLE 26

20 parts of the alcohol-soluble interpolyamide of Example 1, as pellets, were heated with an excess of ethylene oxide in a sealed, glass-lined autoclave at 60–62° C. for 15 hours. The autoclave was then opened and the excess ethylene oxide removed. The reaction product showed a weight increase of 2 parts, this weight representing combined $C_2H_4O$. There was a marked increase in methanol solubility. [J. Polymer Sci. 15, 427 (1955).]

100 parts of the hydroxyethyl polyamide were dissolved in 570 parts of absolute methyl alcohol at 60° C. In this polymer solution were then dissolved 5 parts of N,N'-methylenebisacrylamide, 5 parts of benzophenone, and 0.07 part of methylene blue. The solution was cast into a sheet, air-dried, and cut into chips. The chips were molded into a plaque at 175° C., using 5,000 p.s.i. After cooling, the photosensitive plaque was exposed through a type negative in a vacuum frame for 6 minutes at 4 inches from a water-jacketed UA11 lamp. The exposed plaque was splash-developed for 5 minutes at 25° C. in a solution of absolute methyl alcohol containing 90 g. of anhydrous calcium chloride per liter of methanol. The developed plaque had relief characters corresponding to the transparent areas of the negative, and could be used as a letterpress printing plate.

EXAMPLE 27

A batch of sensitized molding powder was prepared from 90 parts of the alcohol-soluble interpolyamide of Example 1, 0.95 part benzophenone, 0.047 part methylene blue, and 5.6 parts N,N'-methylenebismethacrylamide by dissolving the ingredients in methanol, casting, drying, and chopping as described in Example 16. The photosensitive polyamide was molded into a plate and photoprinted through a 100-line half-tone screen negative with a carbon arc for 1 hour at 5 feet. After exposure, a relief printing plate was made by dissolving away the areas which had not been light hardened. The experiment was repeated with 50 and 100% increases in the N,N'-methylenebismethacrylamide, with similar results.

EXAMPLE 28

A batch of sensitized molding powder was prepared from 90 parts of the alcohol-soluble interpolyamide of Example 1, 0.95 part benzophenone, 0.047 part methylene blue, and 7.8 parts of N,N'-hexamethylenebismethacrylamide by dissolving the ingredients in methanol, casting, drying, chopping as described in Example 16. The photosensitive polyamide was molded into a plate and photoprinted through a 100-line half-tone screen negative with a carbon arc, for 1 hour at 5 feet. After exposure, a relief printing plate was made by dissolving away the areas which had not been light hardened. The experiment was repeated with a 50% increase in the N,N'-hexamethylenebismethacrylamide, with similar results.

EXAMPLE 29

In 180 parts of absolute methanol were dissolved 90 parts of the alcohol-soluble nylon interpolymer of Example 1, 4.5 parts of N,N'-methylenebisacrylamide, 4.5 parts of benzophenone, and 0.018 part of methylene blue. This viscous solution was cast into a sheet and allowed to air-dry overnight. It was then chopped into a molding powder and, under pressure of 10,000 lbs. and 350° F., was formed into a molded photosensitive nylon plate. The plate was exposed for a period of 6 minutes using a G.E. UA11 arc lamp through a negative transparency containing both type and half-tone images. After splashing for 15 minutes at 80° F. with a solution formed by dissolving 90 g. of anhydrous calcium chloride in 1,000 cc. of absolute methanol, a relief-type letterpress printing plate was formed.

EXAMPLE 30

160 parts of absolute methanol and 90 parts of the alcohol-soluble nylon interpolymer of Example 1, were placed in a jacketed stainless steel mixing vat equipped with motor-driven paddles and reflux condenser. After heating for a period of about 2 hours under reflux conditions, a clear solution was obtained, and to this solution was added 4.5 parts of N,N'-methylenebisacrylamide, 4.5 parts of benzophenone, and 0.063 part of methylene blue. A complete solution was obtained after approximately 1 more hour of heating at 147° F., and the solution was then cast, using a stainless steel slit-type applicator upon an endless Teflon-impregnated fiber glass belt. As the wet photosensitive polyamide composition hardened, it was stripped from the belt, cut into sections approximately 5 inches square, and placed in a forced-air dryer operated at room temperature for 18 hours. The material was then removed from the dryer, and chopped with a conventional plastics granulator into a photosensitive nylon molding powder. The drying was completed through the use of a rotating vacuum oven operated at 120° F. with 28 inches of vacuum, for a period of 20 hours. The molding powder was then formed into printing plate blanks by heating the powder into a compression mold for a period of 3 minutes at 350° F., followed by a pressure of 55,000 lbs. in a water-cooled molding press. The photosensitive nylon blank was then bonded to a precurved aluminum back-up plate using a matched set of curved steel dies, the male section of which was kept at 325° F. and the female portion was water-cooled to approximately 70° F. A pressure of approximately 15,000 lbs. was used to curve and bond the nylon to the aluminum plate. The laminated blank was photoexposed through a negative for a period of 2 minutes to the light from 4 G.E. UA11 mercury lamps located approximately 6 inches from the nylon surface. The exposed laminated blank was then developed in a splash machine for a period of 17 minutes at 80° F., using 3 gallons of developer formed by dissolving 10 grams of anhydrous calcium chloride in 1,000 cc. of absolute methanol. To remove the alcohol from the plate surface, the printing plate was dried for a period of fifteen minutes at an air temperature of 125° F. The finished letterpress plate containing half-tone line and type images was placed on the printing press, and excellent printing results were obtained.

EXAMPLE 31

Several of the monomers in accordance with the invention were evaluated for rate of polymerization, rate of insolubilization and the ability to chain transfer with the polyamide. This involved a determination of the rate of polymerization, of the chain transfer constant, of the critical conversion of the monomer before the polyamide insolubilization, of the rate of insolubilization, of the induction period before insolubilization begins, and of the measure of compatibility of the monomer with the polyamide.

The rate at which a particular monomer will insolubilize the polyamide is determined by the rate at which it polymerizes, and the rate at which it chain transfers. A monomer may polymerize rapidly, but if it does not chain transfer it cannot insolubilize, and vice versa. If the rate of either of these reactions is slow, the net result will be a slow rate of insolubilization of the nylon.

The initial rates of polymerization were determined by plotting the logarithm of the fraction of unreacted monomer against time. The rate constant K is defined by the expression $$-\log \frac{M}{M_0} = K I_0^a t$$

In the expression, M is the concentration of monomer at the time $t$; $M_0$ is the initial monomer concentration; $I_0$ is the intensity of the incident light; $a$ is a constant empirically determined to be equal to 3/2; and K is a constant characteristic of the monomer when a particular photoinitiator at a definite concentration is employed.

The chain transfer constant is $C_T$ and may be calculated from the expression $$\text{Log } f_S = XC_T[\log(1-P) - \log(1-P_C)]$$

In this expression $f_S$ is the fraction of the nylon which is still soluble when the monomer conversion is P. $P_C$ is the critical conversion of monomer required before any insolubilization is observed. X is the average degree of polymerization of the nylon, and $C_T$ is the chain transfer constant for the monomer with the nylon.

A standard formulation was used for all of the evaluation work. A total of 93 g. of the alcohol-soluble interpolyamide of Example 1 was dissolved in 525 g. absolute methanol, warming it to 50–60° C. to complete solution. The mixture was cooled to 35–40° C., and 7 g. of the unsaturated compound, the monomer, and 5 g. of benzophenone added. Films were prepared from these solutions, dried at 70% relative humidity, and stored in the dark.

The rate of polymerization of the photosensitive polyamide constituting each film was determined by observing the rate of decrease of the double bond absorption in the infra-red region. In general, the absorption in the 10 micron region, associated with the deformational modes of CH bonds attached to the C═C bonds, was followed. The results of all the measurements are summarized in the following table.

*Evaluation of Divinyl Monomers*

| | Rate Constant for Polymerization, $\text{Min.}^{-1}\times10^3$ | $XC_t$ | $C_t\times10^3$ | $P_c$ | Rate Constant for Insolubilization, $\text{Min.}^{-1}\times10^3$ | Apparent Induction Period, Min. |
|---|---|---|---|---|---|---|
| N,N'-Methylenebisacrylamide | 6.5 | 0.42 | 4.2 | 0.04 | 2.7 | 3.0 |
| N,N'-Methylenebismethacrylamide | 2.2 | 0.08 | 0.08 | 0 | 0.17 | 0 |
| N,N'-Hexamethylenebisacrylamide | 4.5 | 0.50 | 5.0 | 0.06 | 2.1 | 6.5 |
| N,N'-Hexamethylenebismethacrylamide | 0.9 | 0.17 | 1.7 | 0.05 | 0.15 | 14 |

The chain transfer constant $C_T$ is calculated from $XC_T$, assuming X to have a value of 100.

The table indicates that the rate constant for polymerization in all cases is quite good. The chain transfer constant data show that the methacrylic compounds do not chain transfer as efficiently with the polyamide as the acrylic, and consequently the rate of insolubilization is appreciably less. This shows that as the alkyl groups for R and R' increase in chain length, rate of insolubilization decreases. The preference for R and R' as hydrogen, and next as methyl, with the limit of five carbon atoms, is established for these groups with this point in mind.

EXAMPLE 32

100 parts of the interpolymer of Example 1, 5 parts of benzophenone, 5 parts of 1,1,4,4-tetramethyl-tetramethylene-1,4-bisacrylamide and 0.07 part of methylene blue were dissolved in 565 parts of absolute methanol. The solution was cast on to Teflon cloth and allowed to dry in air and then over calcium chloride in a desiccator. The dried product was molded into a disc at 170–175° C. using 5,000 p.s.i. pressure. The disc was exposed behind a type negative transparency for 12 minutes at a distance of 4 inches from a UA11 lamp. The exposed disc was developed for 5 minutes in the splash machine using a solution of 10 g. of calcium chloride per liter of methanol. Type relief images were obtained in the areas of the disc corresponding to the transparent areas of the negative. The disc could be printed as a letter-press printing plate.

EXAMPLE 33

The interpolymer of Example 1 containing 5% N,N'-methylenebisacrylamide, 5% benzophenone and 0.07% methylene blue was dissolved in methanol in the ratio of 4 parts methanol to 1 part interpolymer. This solution was applied to a sheet of anodized aluminum in such a manner as to leave a film of interpolymer 0.0015 inch thick after drying. The film was then exposed through a conventional half-tone and type photographic negative for a total of 3 minutes at 4 inches from a UA11 light source. After normal development, the unlight-hardened portions of the film had been completely removed, exposing the bare aluminum and leaving an interpolymer resist coating 0.0015 inch thick in the lighthardened areas.

The plate was then scanned under a duckbill gun which aspirated a 20% (by volume) suspension of 1250 mesh abrasive in water into an airjet. The scanned area was approximately forty times that of the airjet orifice. After two hours, the plate was removed from the blast machine and proofed, producing a typical letter-press print. The lighthardened interpolymer was then chemically removed and the plate reproofed, again producing a letterpress print of half-tone and type. Total etch depth in the aluminum was approximately 0.008 inch.

EXAMPLE 34

Three plaques approximately 0.100 inch thick were molded from the alcohol-soluble interpolymer of Example 1 containing 5% N,N'-methylenebisacrylamide, 5% benzophenone and 0.07% methylene blue. Plaque A was exposed through a conventional half-tone and type photographic negative for a total of three minutes at a distance of 4 inches from a UA11 light source. Plaque B was exposed through a grid of forty 9/32 inch holes punched in a metal sheet for a total of six minutes at a distance of 4 inches from a UA11 light source. Plaque C was exposed directly to the light with no intervening image for a total of 6 minutes at a distance of 4 inches from a UA11 light source. The three minute period was approximately in the center of the normal exposure range, while the six minute period represented conditions near the maximum end of the normal exposure range.

After exposure, plaque A was conventionally developed until a suitable half-tone and type letter press printing plate was produced. The plate was then proofed.

Examination of the proofs showed plaque A to be an essentially flat printing plate with no dimensional changes having taken place during exposure and development. Plaque B was developed from the side opposite that exposed to the light and the etch rate characteristics of the areas lying beneath the exposed and unexposed surfaces plotted as a function of exposure depth.

Plaque C was sliced parallel to the plane of the exposed surface into samples approximately 0.001 inch thick. Solubility tests were run on these thin slices in boiling methanol and the percent insoluble plotted as a function of exposure depth.

The graphs showed that effective insolubilization during exposure extended only to a distance approximately 0.019 to 0.020 inch below the surface of the plaque. The remainder of the plaques remained unchanged. The plaques were not polymerized throughout by the exposure.

EXAMPLE 35

Three additional letterpress printing plates were made from the same composition as in Example 34 above. Each of these was exposed through a combination of two negatives for 6 minutes at a distance of 4 inches from a UA11 light source.

After exposure, the plates were developed and proofed. Impression was so set that the print was breaking in all areas on the first proof pulled. Impression was gradually increased until satisfactory printing was obtained on all portions of the plate.

From examination of intermediate proofs, it was seen that the solids printed before the highlights in low exposure areas, indicating that the highlight areas lay in a plane slightly below that of the solids. This phenomenon became less and less prominent as exposure was increased. Accurate control of exposure conditions makes it possible to produce a built-in makeready into the letterpress printing plate. Such a makeready is a highly desirable feature since it decreases the effect of highlight dot spread and increases the life of the plate.

EXAMPLE 36

Compositions were prepared containing 100 parts of the interpolymer of Example 1, 10 parts of N,N′-hexamethylenebisacrylamide, 5 parts of benzophenone and 0.07 part of hydroquinone. These were molded in a special mold which gave a thick (approximately 100 mils) section for plate making and a 3 mil section for transmission measurements. The heating and cooling cycles of the molding operation were varied to give samples of varying turbidity.

The table relates the turbidity of the specimens with the properties of half-tone printing plates made from them. These plates were made using a point source light at substantially normal incidence.

*Dependence of Etch Depth and Sensitivity Upon Plate Turbidity*

| Plate No. | Percent Transmission of 3 Mil Film at 365 mμ | Turbidity in Mils$^{-1}$ | Etch Depth [1] in Microns | Minimum [2] Relative Exposure |
|---|---|---|---|---|
| *a* | 22 | 0.171 | 30 | 50 |
| *b* | 15 | 0.226 | 55 | 9 |
| *c* | 27 | 0.138 | 40 | 6 |
| *d* | 20 | 0.185 | 40 | 6 |
| *e* | 42 | 0.077 | 60 | 18 |
| *f* | 44 | 0.070 | 60 | 13 |
| *g* | 51 | 0.050 | 60 | 18 |
| *h* | 44 | 0.070 | 65 | 18 |
| *j* | 55 | 0.038 | ---------- | 100 |
| *k* | 46 | 0.062 | 50 | 25 |
| *l* | 41.5 | 0.079 | 45 | 36 |
| *m* | 20 | 0.185 | 35 | 9 |
| *n* | 33 | 0.112 | 50 | 18 |
| *o* | 36 | 0.100 | 40 | 9 |
| *p* | 32 | 0.117 | 50 | 9 |
| *q* | 26 | 0.146 | 40 | 13 |

[1] Depth at double the minimum exposure.
[2] Least exposure to retain highlight dots.

The data show that depth decreases with increasing turbidity, and that the exposure required to prevent loss of highlights decreases with increasing turbidity. The turbidity range should be between 0.01 and 0.5 mil$^{-1}$.

EXAMPLE 37

A polyamide resin of the four component interpolymer type was prepared from a charge of 45 parts hexamethylenediammonium adipate, 40 parts hexamethylenediammonium sebacate, 13 parts caprolactam and 85 parts of water. The charge was placed in a glass-lined autoclave, the air replaced with nitrogen and the autoclave closed. The reaction cycle was as follows:

| Temperature, °C. | Time, hours | Pressure |
|---|---|---|
| 250–260 | 1½ | 200–300 p.s.i. |
| 250–260 | 1¼ | Pressure reduced to atmospheric by slow distillation of water. |
| 250–260 | 1¼ | Pressure slowly reduced to 2 mm. |
| 250–260 | 1¼ | Pressure at 2 mm. |

At the end of the heating cycle the autoclave was closed, and the polymer allowed to cool under vacuum. The polymer was light-colored, tough, and readily cold-drawn. The softening point was 160° C. (Parr melting point bar).

The interpolymer was converted into a finely-divided form by dissolving 1 part of the interpolymer in 10 parts of formic acid at 25° C. 14 parts of absolute methyl alcohol followed by 21 parts of diethyl ether were added with stirring to precipitate the polymer as particles. The polymer particles were filtered, washed thoroughly by slurrying three times with ether, dried in air, and then in an oven at 105° C. for one and one-half hours.

The photosensitive polyamide composition was prepared by slurrying the polymer particles in a solution in 970 parts of absolute methyl alcohol of 5 parts N,N′-methylenebisacrylamide, 5 parts of benzophenone, and 0.07 part of methylene blue. The alcohol was allowed to evaporate and the composition dried over anhydrous calcium chloride for twenty hours. The powder was molded into a plate at about 175° C. under a pressure of 5,000 p.s.i.

The plate was exposed through a type negative in a vacuum frame for six minutes at 4 inches from a water-jacketed UA11 lamp. The exposed plate was splash-developed for five minutes at 250° C. in a solution of absolute methyl alcohol containing 90 g. of anhydrous calcium chloride per liter of methanol. The developed plate had relief characters corresponding to the transparent areas of the negative.

EXAMPLE 38

10 parts of 5-acrylylamino-N-allylcaproamide, 5 parts of benzophenone, and 0.07 part of methylene blue were dissolved in 130 parts of absolute methyl alcohol. This solution was made into a slurry with 100 parts of alcohol-insoluble polycaprolactam. The alcohol was allowed to evaporate to dryness, and the residue dried over anhydrous calcium chloride for about 40 hours. The resulting powder was molded into a plaque at about 210° C. under a pressure of 5,000 p.s.i. The plaque was quench-cooled. Exposure through a type negative in a vacuum frame was made for 15 minutes to a water-jacketed UA11 lamp, a 1200 watt (quartz tube) medium pressure mercury vapor lamp, at 4 inches. The exposed plaque was splash-developed for 15 minutes at 25° C. in a solution of absolute methyl alcohol containing 200 g. of anhydrous calcium chloride per liter of methanol. The resulting printing plate showed relief areas corresponding to the transparent areas of the type negative.

EXAMPLE 39

100 parts of alcohol-soluble interpolymer of hexamethylenediammonium adipate, hexamethylenediammonium sebacate, and ε-caprolactam (composition: 40:30:40 [by analysis]), softening point 144° C. were dissolved in 570 parts of absolute methyl alcohol at 60° C. In the polymer solution were then dissolved 10 parts of 5-acrylylamino-N-allylcaproamide, 5 parts of benzophenone, and 0.07 part of methylene blue. The solution was cast into a sheet, air-dried, and cut into chips. The chips were molded into a plaque at 175° C. using 5,000 p.s.i. After cooling, the plaque was exposed through a type negative in a vacuum frame for 15 minutes at 4 inches from a water-jacketed UA11 lamp. The exposed plaque was splash-developed for 5 minutes at 25° C. in a solution of absolute methyl alcohol containing 90 g. of anhydrous calcium chloride per liter of methanol. The developed printing plate had relief characters corresponding to the transparent areas of the negative.

EXAMPLE 40

10 parts of acrylylamino-N-allylacetamide and 5 parts of benzophenone were dissolved in a small quantity of anhydrous ether. This solution was then poured over 90 parts of the alcohol-soluble interpolyamide of Example 39, and mixed until the mass was dry. The powder was placed in a flash-type molding cavity equipped with a cut-off and, under a pressure of 10,000 lbs. and a temperature of 135° C., was formed into a molded disc. This mold was slowly cooled and the disc removed from the mold at room temperature. The disc was photoprinted using a type negative and a carbon arc exposure of 30 minutes. The disc was developed in a splash machine using a developer with a specific gravity of 0.95 formed by dissolving anhydrous calcium chloride in ethanol. A relief-type printing plate was obtained.

EXAMPLE 41

To 120 parts of alcohol were added 90 parts of the alcohol-soluble interpolyamide of Example 39, 7 parts of 2-acrylylamino-N,N'-diallylglutaramide, 1 part of benzophenone, and 0.07 part of methylene blue. This mixture was then heated at about 140° F. until a complete solution was obtained. The material was cast into a sheet, allowed to dry and cool, chopped by a conventional plastics chopper to a small pellet form, and dried for 48 hours at room temperature. The pellets were then placed in a heated mold at 315° F. for 4 minutes. The mold was then placed in a press with cold platens, and a total load of 12,000 lbs. was applied to the mold.

After the mold had reached room temperature, it was opened and a clear photosensitive nylon plate was removed. This plaque was exposed through a negative containing both type and half-tone to a carbon arc for a period of 1 hour. The photoinsolubilized plate was then developed in a splash developing machine operating at 100° F. for a period of 15 minutes, using a developer formed by dissolving 90 g. of anhydrous calcium chloride in 1 liter of methyl alcohol. When the plate was dried, there were relief images of type and half-tone formed into the plate surface, corresponding to the light areas on the negative. It was a letterpress relief printing plate.

EXAMPLE 42

To 120 parts of methyl alcohol were added 90 parts of the alcohol-soluble interpolyamide of Example 39, 5.5 parts of 5-acrylylamino-N-allylcaproamide, 1 part of benzophenone, and 0.07 part of methylene blue.

The mixture was heated at 140° F. until a complete solution was obtained, and then the viscous solution was cast upon a Teflon (polytetrafluoroethylene)-impregnated glass cloth belt, and allowed to cool and dry until a sheet was formed. The material was then chopped in the conventional plastics chopper and placed in a mold cavity at 315° C. for 4 minutes. The pressure on the cavity was then increased to 12,000 lbs., and the platens were brought to room temperature.

The molded photosensitive plate was then exposed through a type and half-tone negative by a carbon arc for a period of 1 hour. It was placed in the splash developing machine and developed for 15 minutes at 100° F., using as a developer a solution formed by dissolving 90 g. of calcium chloride in 1 liter of methanol. After drying, the relief printing plate surface had letters and half-tone dots in relief, as any normal letterpress printing plate.

EXAMPLE 43

100 parts of alcohol-soluble N-methoxymethyl polyhexamethyleneadipamide were dissolved in 570 parts of absolute methyl alcohol at 60° C. The nylon had a melting point of 170–180° C. and a dilution value of 54, using the acetone-precipitation method described by Cairns et al., J. Am. Chem. Soc., 71, 653 (1949). These properties correspond to a methoxyl content of about 8.3%. In the polymer solution were dissolved 5.5 parts of acrylylamino-N-allylacetamide, 5 parts of benzophenone, and 0.07 part of methylene blue. The solution was cast into a sheet, air-dried, and cut into chips. The chips were molded into a plaque at 160° C., using 5,000 p.s.i. After cooling, the photosensitive plaque was exposed through a type negative in a vacuum frame for 6 minutes at 4 inches from a water-jacketed UA11 lamp. The exposed plaque was splash-developed for 5 minutes at 25° C. in a solution of absolute methyl alcohol containing 90 g. of anhydrous calcium chloride per liter of methanol. The developed plaque had relief characters corresponding to the transparent areas of the negative, and was a letterpress printing plate.

EXAMPLE 44

20 parts of the alcohol-soluble interpolyamide of Example 39, as pellets, were heated with an excess of ethylene oxide in a sealed, glass-lined autoclave at 60–62° C. for 15 hours. The autoclave was then opened and the excess ethylene oxide removed. The reaction product showed a weight increase of 2 parts, this weight representing combined $C_2H_4O$. There was a marked increase in methanol solubility (J. Polymer Sci. 15, 427 (1955)).

100 parts of the hydroxyethyl polyamide were dissolved in 570 parts of absolute methyl alcohol at 60° C. In this polymer solution were then dissolved 5.5 parts acrylylamino-N-allylacetamide, 5 parts of benzophenone, and 0.07 part of methylene blue. The solution was cast into a sheet, air-dried, and cut into chips. The chips were molded into a plaque at 175° C., using 5,000 p.s.i. After cooling, the photosensitive plaque was exposed through a type negative in a vacuum frame for 6 minutes at 4 inches from a water-jacketed UA11 lamp. The exposed plaque was splash-developed for 5 minutes at 25° C. in a solution of absolute methyl alcohol containing 90 g. of anhydrous calcium chloride per liter of methanol. The developed plaque had relief characters corresponding to the transparent areas of the negative, and was a letterpress printing plate.

EXAMPLE 45

160 parts of absolute methanol and 90 parts of the alcohol-soluble nylon interpolymer of Example 39, were placed in a jacketed stainless steel mixing vat equipped with motor-driven paddles and reflux condenser. After heating for a period of about 2 hours under reflux conditions, a clear solution was obtained, and to this solution was added 6 parts of 5-acrylylamino-N-allylcaproamide, 4.5 parts of benzophenone, and 0.063 part of methylene blue. A complete solution was obtained after approximately 1 more hour of heating at 147° F., and the solution was then cast, using a stainless steel slit-type applicator upon an endless Teflon-impregnated fiber glass belt. As the wet photosensitive polyamide composition hardened, it was stripped from the belt, cut into sections approximately 5 inches square, and placed in a forced-air dryer operated at room temperature for 18 hours. The material was then removed from the dryer, chopped with a conventional plastics granulator intot a photosensitive nylon molding powder. The drying was completed through the use of a rotating vacuum oven operated at 120° F. with 28 inches of vacuum, for a period of 20 hours. The molding powder was then formed into printing plate blanks by heating the powder in a compression mold for a period of 3 minutes at 350° F., followed by a pressure of 55,000 lbs. in a water-cooled molding press. The photosensitive nylon blank was then bonded to a precurved aluminum backup plate using a matched set of curved steel dies, the male section of which was kept at 325° F. and the female portion was water-cooled to approximately 70° F. A pressure of approximately 15,000 lbs. was used to curve and bond the nylon to the aluminum plate. The laminated blank was photoexposed through a negative for a period of 2 minutes to the light from 4 G.E. UA11 mercury lamps located approximately 6 inches from the nylon surface. The exposed laminated blank was then developed in a splash machine for a period of 17 minutes at 80° F., using 3 gallons of developer formed by dissolving 10 grams of anhydrous calcium chloride in 1,000 cc. of absolute methanol. To remove the alcohol from the plate surface, the printing plate was dried for a period of 15 minutes at an air temperature of 125° F. The finished letterpress plate containing half-tone line and type images was placed on the printing press, and excellent printing results were obtained.

EXAMPLE 46

10 parts ethylene bisallylmaleate, 5 parts benzophenone, and .05 part pyrogallol were dissolved in a small amount of anhydrous ether. This solution was then mixed with 90 parts of the polyamide of example 1, and the mixture was stirred to dryness. Powder was placed in a mold cavity and under a pressure of 10,000 lbs. and 135° C. temperature, a good clear flexible molded disk was made. The disk was then exposed using a type negative and a 2 hour carbon arc exposure. After developing in a solution of 104 grams of calcium chloride in 1 liter of methanol for 15 minutes, letterpress relief images of type were formed in the nylon disk.

EXAMPLE 47

To 450 parts of methyl alcohol was added 90 parts of the polyamide of Example 1, 2 parts of benzophenone, 4 parts of diallylmaleate, and .05 part of methylene blue. This material was heated at about 130° F. until a clear solution was obtained. This solution was then cast on a glass plate, allowed to dry overnight, and a thin sheet was formed which was then cut into small pieces and placed in a molding cavity heated to a temperature of 350° F. for 3 minutes. The hot mold was then placed in a cold press, and a pressure of about 50,000 lbs. was placed on the mold until it had cooled to room temperature. The clear, uniform molded plate was removed from the mold cavity and was exposed through a negative image containing both half-tone and type with a UA11 mercury lamp for a period of 60 minutes. The plate was then developed in a splash developing machine for a period of 15 minutes at 80° F. using a developer formed by dissolving 90 grams of calcium chloride in 1 liter of methanol. The surface contained relief images of both half-tone and type, etched into the surface of the plaque.

The terms "soluble," "insoluble" and "photoinsolubilized" as used to characterize the polyamide refer to solubility in the developer.

All parts and percentages in the specification and claims are by weight, unless otherwise specified.

What is claimed is:

1. A photosensitive printing plate having a surface comprising a hard, wear resistant mixture in the relative proportions of from about 90% to about 99% by weight of a soluble, thermoplastic synthetic, linear polyamide being free from recurring basic imino groups and containing carbonamide groups as an integral part of the polymer chain, and from about 10% to about 1% by weight respectively of an unsaturated compound having a boiling point of at least 100° C. and having at least two $CH_2{=}C{=}$ groups with at least one additional $CH_2{=}C{=}$ group when two allyl groups are present.

2. A photosensitive printing plate as claimed in claim 1 wherein the unsaturated compound has the structure $$CH_2{=}\underset{R}{\underset{|}{C}}{-}CONH{-}X{-}NHCO{-}\underset{R'}{\underset{|}{C}}{=}CH_2$$

in which X is selected from the group consisting of straight and branched alkylene groups having from one to ten carbon atoms and having from one to six carbon atoms in a straight chain connecting the nitrogen atoms of the amido groups, the remaining carbon atoms, if any, being present as alkyl radicals attached to the said chain, and R and R' are selected from the group consisting of hydrogen and alkyl groups having from one to five carbon atoms.

3. A photosensitive printing plate as claimed in claim 2 wherein the unsaturated compound is N,N'-methylenebisacrylamide.

4. A photosensitive printing plate as claimed in claim 2 wherein the unsaturated compound is N,N'-hexamethylenebisacrylamide.

5. A photosensitive printing plate as claimed in claim 1 wherein the unsaturated compound has the structure $$CH_2{=}\underset{R}{\underset{|}{C}}{-}CONH{-}X{-}CONH{-}CH_2CH{=}CH_2$$

in which X is selected from the group consisting of straight and branched alkylene groups having from one to ten carbon atoms and having from one to six carbon atoms in a straight chain connecting the nitrogen atom of the first amido group with the carbon atom of the second amido group, the remaining carbon atoms, if any, being present as alkyl radicals attached to the said chain, and R is selected from the group consisting of hydrogen and alkyl groups having from one to five carbon atoms.

6. A photosensitive printing plate as claimed in claim 1 which also contains a photoinitiator for the photopolymerization thereof free from ortho chelating groups and having the structure

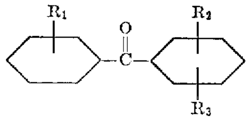

where $R_1$, $R_2$ and $R_3$ are selected from the group consisting of hydrogen, halogen, hydroxyl, carboxylic, alkyl and alkoxy groups, the alkyl and alkoxy groups having from one to five carbon atoms, and the carboxylic groups having the formula COOM where M is selected from the group consisting of hydrogen, metal cations, and alkyl radicals having from one to five carbon atoms.

7. A process for forming a photoinsolubilized printing plate which comprises exposing to actinic light through an image-bearing transparency selected portions of a photosensitive printing plate having a surface comprising a hard, wear resistant mixture in the relative proportions of from about 90% to about 99% by weight of a soluble, thermoplastic, synthetic, linear polyamide being free from recurring basic imino groups and containing carbonamide groups as an integral part of the polymer chain, and from about 10% to about 1% by weight respectively of an unsaturated compound having a boiling point of at least 100° C. and having at least two $CH_2{=}C{=}$ groups with at least one additional $CH_2{=}C{=}$ group when two allyl groups at present, in order to convert said polyamide to an insoluble form in the exposed portions, and then washing away unexposed soluble polyamide.

8. A process as claimed in claim 7 wherein the unsaturated compound has the structure $$CH_2=\underset{R}{\underset{|}{C}}-CONH-X-NHCO-\underset{R'}{\underset{|}{C}}=CH_2$$

in which X is selected from the group consisting of straight and branched alkylene groups having from one to ten carbon atoms and having from one to six carbon atoms in a straight chain connecting the nitrogen atoms of the amido groups, the remaining carbon atoms, if any, being present as alkyl radicals attached to the said chain, and R and R' are selected from the group consisting of hydrogen and alkyl groups having from one to five carbon atoms.

9. A process as claimed in claim 8 wherein the unsaturated compound is N,N'-methylenebisacrylamide.

10. A process as claimed in claim 8 wherein the unsaturated compound is N,N'-hexamethylenebisacrylamide.

11. A process as claimed in claim 7 wherein the unsaturated compound has the structure $$CH_2=\underset{R}{\underset{|}{C}}-CONH-X-CONH-CH_2CH=CH_2$$

in which X is selected from the group consisting of straight and branched alkylene groups having from one to ten carbon atoms and having from one to six carbon atoms in a straight chain connecting the nitrogen atom of the first amido group with the carbon atom of the second amido group, the remaining carbon atoms, if any, being present as alkyl radicals attached to the said chain, and R is selected from the group consisting of hydrogen and alkyl groups having from one to five carbon atoms.

12. A process as claimed in claim 7 wherein the photosensitive printing plate also contains a photoinitiator having the structure

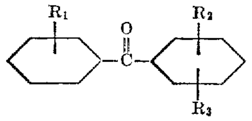

wherein $R_1$, $R_2$ and $R_3$ are selected from the group consisting of hydrogen, halogen, hydroxyl, carboxylic, alkyl and alkoxy groups, the alkyl and alkoxy groups having from one to five carbon atoms, and the carboxylic groups having the formula COOM where M is selected from the group consisting of hydrogen, metal cations, and alkyl radicals having from one to five carbon atoms.

13. A photoinsolubilized printing plate having a surface comprising the insoluble product of the reaction of a mixture in the relative proportions of from about 90% to about 99% by weight of a soluble, thermoplastic, synthetic, linear polyamide being free from recurring basic imino groups and containing carbonamide groups as an integral part of the polymer chain, and from about 10% to about 1% by weight respectively of an unsaturated compound having a boiling point of at least 100° C. and having at least two $CH_2=C=$ groups with at least one additional $CH_2=C=$ group when two allyl groups are present.

14. A photoinsolubilized printing plate as claimed in claim 13 wherein the unsaturated compound has the structure $$CH_2=\underset{R}{\underset{|}{C}}-CONH-X-NHCO-\underset{R'}{\underset{|}{C}}=CH_2$$

in which X is selected from the group consisting of straight and branched alkylene groups having from one to ten carbon atoms and having from one to six carbon atoms in a straight chain connecting the nitrogen atoms of the amido groups, the remaining carbon atoms, if any, being present as alkyl radicals attached to the said chain, and R and R' are selected from the group consisting of hydrogen and alkyl groups having from one to five carbon atoms.

15. A photoinsolubilized printing plate as claimed in claim 14 wherein the unsaturated compound is N,N'-methylenebisacrylamide.

16. A photoinsolubilized printing plate as claimed in claim 14 wherein the unsaturated compound is N,N'-hexamethylenebisacrylamide.

17. A photoinsolubilized printing plate as claimed in claim 13 wherein the unsaturated compound has the structure $$CH_2=\underset{R}{\underset{|}{C}}-CONH-X-CONH-CH_2CH=CH_2$$

in which X is selected from the group consisting of straight and branched alkylene groups having from one to ten carbon atoms and having from one to six carbon atoms in a straight chain connecting the nitrogen atom of the first amido group with the carbon atom of the second amido group, the remaining carbon atoms, if any, being present as alkyl radicals attached to the said chain, and R is selected from the group consisting of hydrogen and alkyl groups having from one to five carbon atoms.

References Cited in the file of this patent

UNITED STATES PATENTS

| | | |
|---|---|---|
| 1,903,500 | Calcott et al. | Apr. 11, 1933 |
| 2,067,234 | Gordon et al. | Jan. 12, 1937 |
| 2,101,107 | Strain | Dec. 7, 1937 |
| 2,155,590 | Garvey | Apr. 25, 1939 |
| 2,475,980 | Murray | July 12, 1949 |
| 2,484,529 | Roedel | Oct. 11, 1949 |
| 2,510,503 | Kropa | June 6, 1950 |
| 2,548,520 | Damaschroder et al. | Apr. 10, 1951 |
| 2,643,958 | Kleiner et al. | June 30, 1953 |
| 2,673,151 | Gerhart | Mar. 23, 1954 |
| 2,742,440 | Scott et al. | Apr. 17, 1955 |
| 2,760,863 | Plambeck | Aug. 28, 1956 |
| 2,972,540 | Saner et al. | Feb. 21, 1961 |
| 2,997,391 | Murray et al. | Aug. 22, 1961 |

FOREIGN PATENTS

| | | |
|---|---|---|
| 1,177,742 | France | Dec. 8, 1958 |
| 679,562 | Great Britain | Sept. 17, 1952 |

UNITED STATES PATENT OFFICE
CERTIFICATE OF CORRECTION

March 12, 1963

Patent No. 3,081,168

Robert M. Leekley et al.

It is hereby certified that error appears in the above numbered patent requiring correction and that the said Letters Patent should read as corrected below.

Column 4, lines 53 to 55, extreme right-hand portion of the formula, for "-$CH_2$" read -- =$CH_2$ --; column 21, line 45, after "heated" insert -- sheet --; column 23, line 1, for "intot" read -- into --; column 24, line 73, for "at" read -- are --.

Signed and sealed this 1st day of October 1963.

(SEAL)
Attest:

ERNEST W. SWIDER
Attesting Officer

DAVID L. LADD
Commissioner of Patents